US012610847B2

(12) United States Patent
Li et al.

(10) Patent No.: US 12,610,847 B2
(45) Date of Patent: Apr. 21, 2026

(54) PACKAGING METHOD AND PACKAGE MEMBER

(71) Applicant: SKY CHIP INTERCONNECTION TECHNOLOGY CO., LTD., Shenzhen (CN)

(72) Inventors: Yuhong Li, Shenzhen (CN); Haoyang Xiao, Shenzhen (CN); Chenshan Gao, Shenzhen (CN); Guanqiang Song, Shenzhen (CN); Jing Jiang, Shenzhen (CN)

(73) Assignee: SKY CHIP INTERCONNECTION TECHNOLOGY CO., LTD., Shenzhen (CN)

( * ) Notice: Subject to any disclaimer, the term of this patent is extended or adjusted under 35 U.S.C. 154(b) by 366 days.

(21) Appl. No.: 18/459,043

(22) Filed: Aug. 30, 2023

(65) Prior Publication Data

US 2024/0021555 A1     Jan. 18, 2024

Related U.S. Application Data

(63) Continuation of application No. PCT/CN2023/093328, filed on May 10, 2023.

(30) Foreign Application Priority Data

Jul. 12, 2022     (CN) .......................... 202210822752.0

(51) Int. Cl.
H01L 21/78 (2006.01)
H10W 74/01 (2026.01)
(Continued)

(52) U.S. Cl.
CPC ........ H10W 74/111 (2026.01); H10W 74/019 (2026.01); *H10W 80/312* (2026.01); *H10W 90/794* (2026.01)

(58) Field of Classification Search
CPC ... H01L 24/08; H01L 21/568; H01L 23/3107; H01L 24/80; H01L 2224/08225;
(Continued)

(56) References Cited

U.S. PATENT DOCUMENTS 6,953,988 B2 * 10/2005 Seo .......................... H01L 24/29
                                                              257/796
8,020,289 B2 * 9/2011 Sugimoto ............ H05K 3/3415
                                                              29/841
(Continued)

FOREIGN PATENT DOCUMENTS

CN          101106118 A      1/2008
CN          103762187 A      4/2014
(Continued)

OTHER PUBLICATIONS

Chinese First Office Action,Chinese Application No. 202210822752. 0, mailed Apr. 23, 2025 (13 pages).
(Continued)

*Primary Examiner* — Vu A Vu

(57) ABSTRACT

A packaging method includes: obtaining a carrier and processing a first pad on a side surface of the carrier; processing a second pad on a side surface of the first pad away from the carrier; obtaining a first sealing material, pressing the first sealing material with the second pad, the first pad, and a side surface of the carrier on which the first pad is arranged to form a first sealing member; processing a chip pad on a side surface of each first pad away from the second pad; mounting a chip on at least one chip pad; obtaining a second sealing material, pressing the second sealing material with the chip, a side surface of the chip pad away from the second pad, and a side surface of the first sealing member near the first pad, to form a second sealing member.

20 Claims, 6 Drawing Sheets

700

(51) Int. Cl.

| | |
|---|---|
| *H10W 74/10* | (2026.01) |
| *H10W 80/00* | (2026.01) |
| *H10W 90/00* | (2026.01) |

(58) Field of Classification Search

CPC ....... H01L 2224/80895; H01L 23/3121; H01L 23/49861; H01L 24/18; H01L 2221/68345; H01L 2221/68359; H01L 21/6835

USPC ......................................................... 257/668

See application file for complete search history.

(56) References Cited

U.S. PATENT DOCUMENTS

| | | | | |
|---|---|---|---|---|
| 8,201,326 | B2 * | 6/2012 | Ewe ........................ | H01L 24/24 |
| | | | | 29/830 |
| 8,237,292 | B2 * | 8/2012 | Shibuya ............. | H01L 23/3121 |
| | | | | 257/788 |
| 8,970,049 | B2 * | 3/2015 | Karnezos ........... | H01L 25/0657 |
| | | | | 257/E21.705 |
| 9,048,222 | B2 * | 6/2015 | Hung .................... | H01L 21/565 |
| 9,941,146 | B2 * | 4/2018 | Rusli ................... | H01L 21/6835 |
| 11,515,290 | B2 * | 11/2022 | Choi .................... | H01L 25/0652 |
| 2007/0262470 | A1 * | 11/2007 | Ichiryu .............. | H01L 23/3121 |
| | | | | 257/E23.125 |
| 2014/0203291 | A1 * | 7/2014 | Nakamura ........... | H01L 25/105 |
| | | | | 257/737 |

FOREIGN PATENT DOCUMENTS

| | | |
|---|---|---|
| CN | 103867281 A | 6/2014 |
| CN | 104779220 A | 7/2015 |
| CN | 106601634 A | 4/2017 |
| CN | 106601635 B | 7/2019 |
| CN | 111433906 B | 7/2021 |
| CN | 115312393 A | 11/2022 |
| WO | 2021023306 A1 | 2/2021 |

OTHER PUBLICATIONS

International search report and Written Opinion, Application No. PCT/CN2023/093328, mailed Jul. 6, 2023 (13 pages).

* cited by examiner

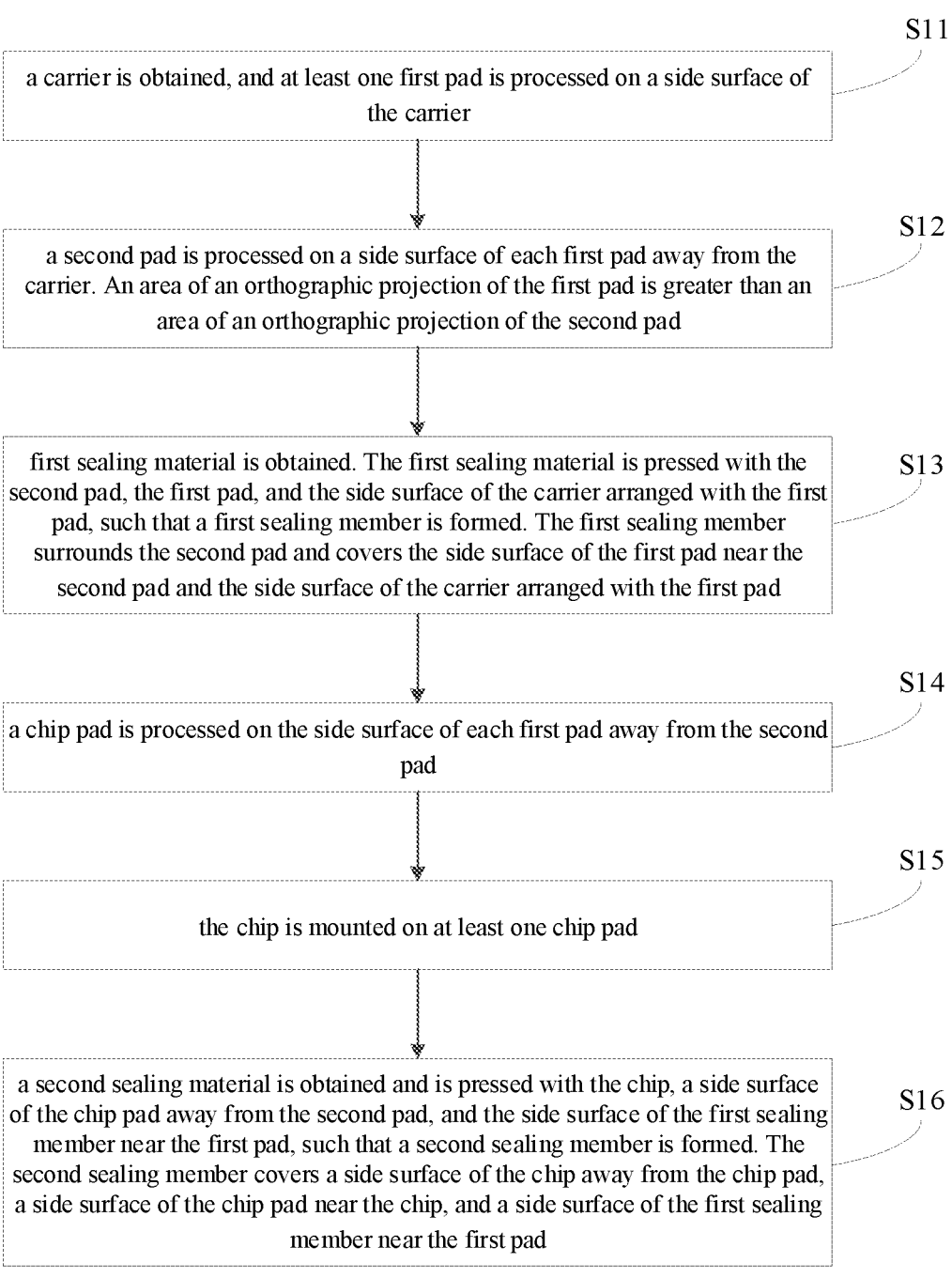

S11 a carrier is obtained, and at least one first pad is processed on a side surface of the carrier

S12 a second pad is processed on a side surface of each first pad away from the carrier. An area of an orthographic projection of the first pad is greater than an area of an orthographic projection of the second pad

S13 first sealing material is obtained. The first sealing material is pressed with the second pad, the first pad, and the side surface of the carrier arranged with the first pad, such that a first sealing member is formed. The first sealing member surrounds the second pad and covers the side surface of the first pad near the second pad and the side surface of the carrier arranged with the first pad

S14 a chip pad is processed on the side surface of each first pad away from the second pad

S15 the chip is mounted on at least one chip pad

S16 a second sealing material is obtained and is pressed with the chip, a side surface of the chip pad away from the second pad, and the side surface of the first sealing member near the first pad, such that a second sealing member is formed. The second sealing member covers a side surface of the chip away from the chip pad, a side surface of the chip pad near the chip, and a side surface of the first sealing member near the first pad

FIG. 1

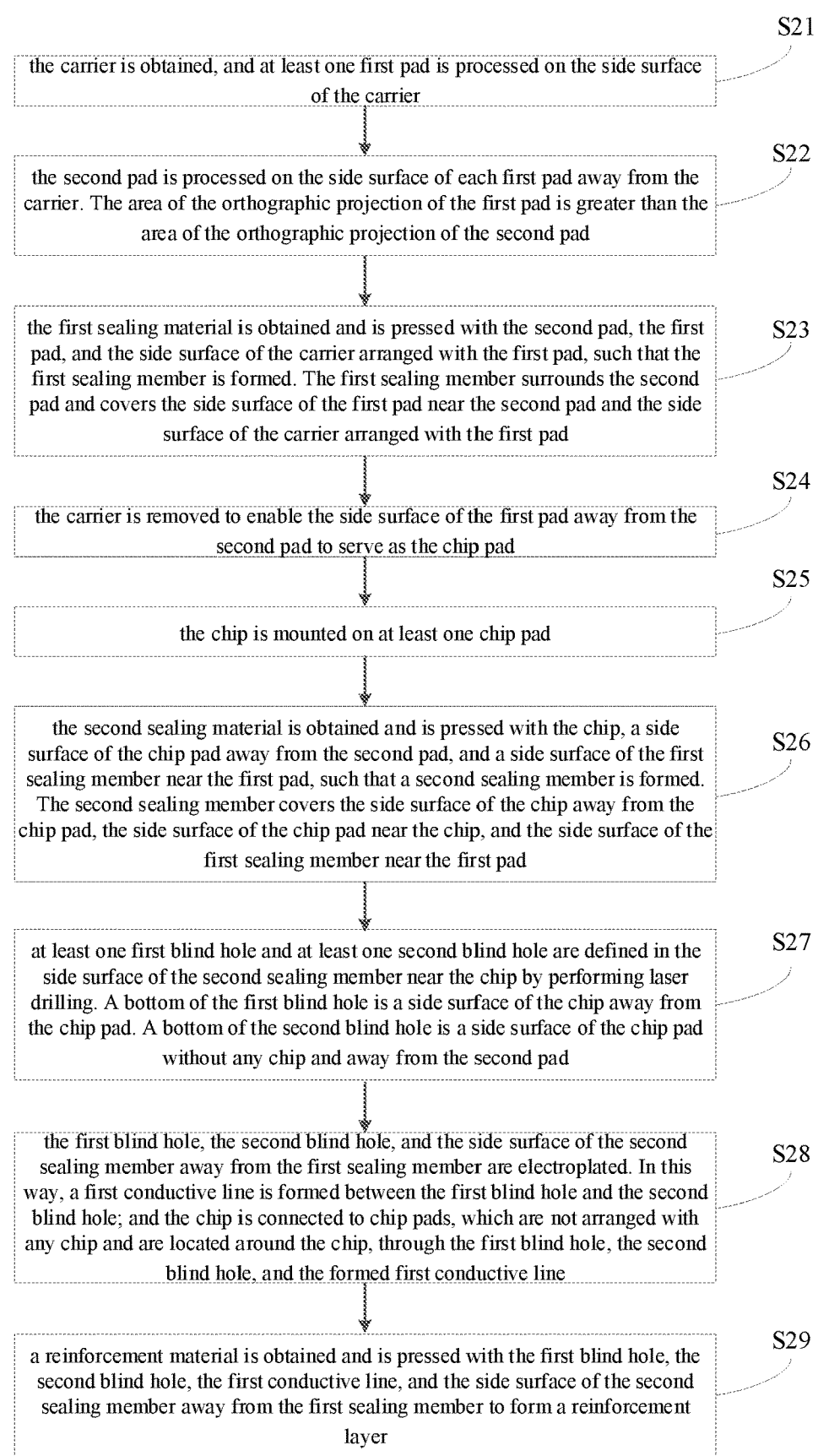

S21 the carrier is obtained, and at least one first pad is processed on the side surface of the carrier

S22 the second pad is processed on the side surface of each first pad away from the carrier. The area of the orthographic projection of the first pad is greater than the area of the orthographic projection of the second pad

S23 the first sealing material is obtained and is pressed with the second pad, the first pad, and the side surface of the carrier arranged with the first pad, such that the first sealing member is formed. The first sealing member surrounds the second pad and covers the side surface of the first pad near the second pad and the side surface of the carrier arranged with the first pad

S24 the carrier is removed to enable the side surface of the first pad away from the second pad to serve as the chip pad

S25 the chip is mounted on at least one chip pad

S26 the second sealing material is obtained and is pressed with the chip, a side surface of the chip pad away from the second pad, and a side surface of the first sealing member near the first pad, such that a second sealing member is formed. The second sealing member covers the side surface of the chip away from chip pad, the side surface of the chip pad near the chip, and the side surface of the first sealing member near the first pad

S27 at least one first blind hole and at least one second blind hole are defined in the side surface of the second sealing member near the chip by performing laser drilling. A bottom of the first blind hole is a side surface of the chip away from the chip pad. A bottom of the second blind hole is a side surface of the chip pad without any chip and away from the second pad

S28 the first blind hole, the second blind hole, and the side surface of the second sealing member away from the first sealing member are electroplated. In this way, a first conductive line is formed between the first blind hole and the second blind hole; and the chip is connected to chip pads, which are not arranged with any chip and are located around the chip, through the first blind hole, the second blind hole, and the formed first conductive line

S29 a reinforcement material is obtained and is pressed with the first blind hole, the second blind hole, the first conductive line, and the side surface of the second sealing member away from the first sealing member to form a reinforcement layer

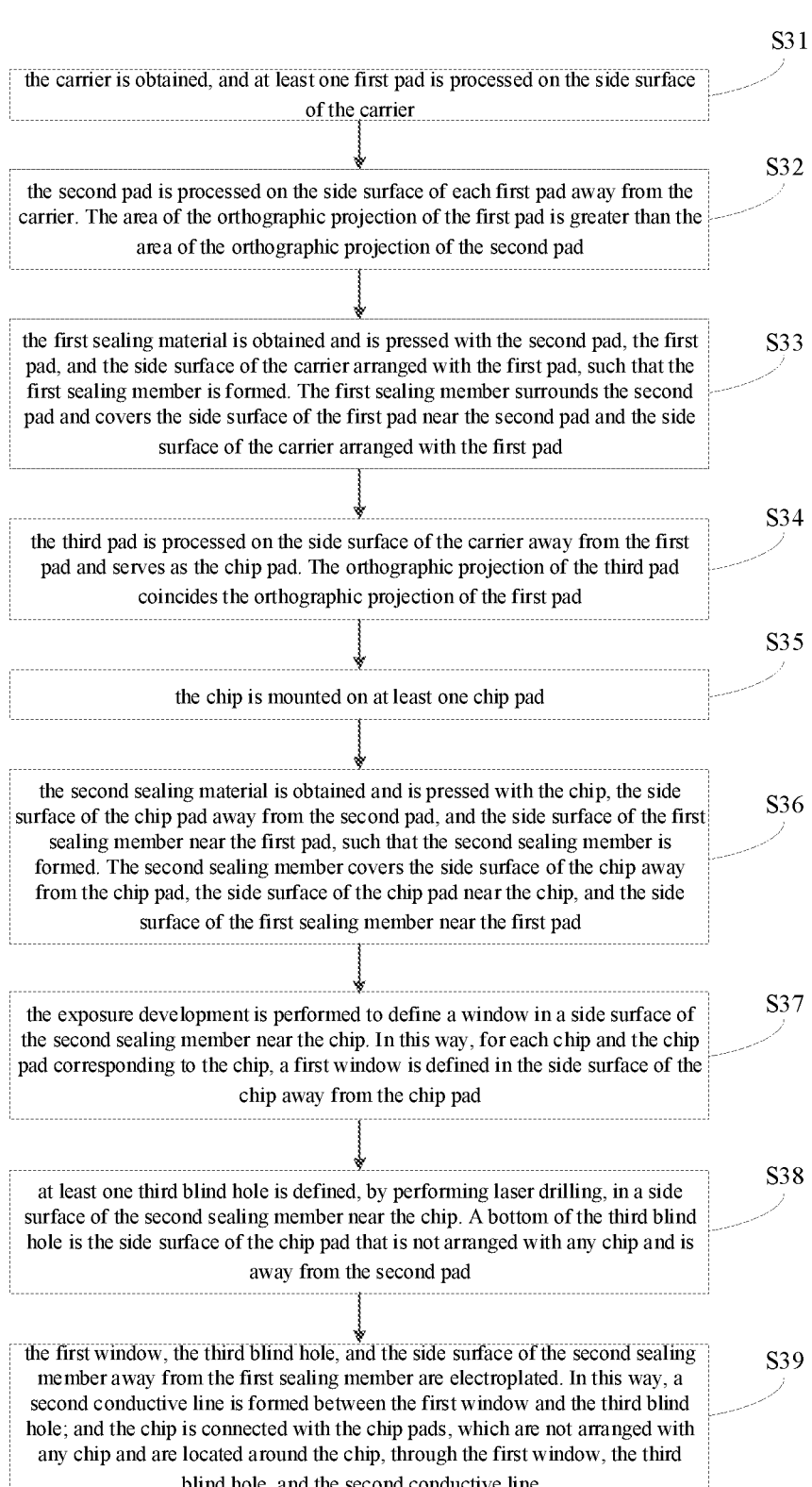

S31 the carrier is obtained, and at least one first pad is processed on the side surface of the carrier

S32 the second pad is processed on the side surface of each first pad away from the carrier. The area of the orthographic projection of the first pad is greater than the area of the orthographic projection of the second pad

S33 the first sealing material is obtained and is pressed with the second pad, the first pad, and the side surface of the carrier arranged with the first pad, such that the first sealing member is formed. The first sealing member surrounds the second pad and covers the side surface of the first pad near the second pad and the side surface of the carrier arranged with the first pad

S34 the third pad is processed on the side surface of the carrier away from the first pad and serves as the chip pad. The orthographic projection of the third pad coincides the orthographic projection of the first pad

S35 the chip is mounted on at least one chip pad

S36 the second sealing material is obtained and is pressed with the chip, the side surface of the chip pad away from the second pad, and the side surface of the first sealing member near the first pad, such that the second sealing member is formed. The second sealing member covers the side surface of the chip away from the chip pad, the side surface of the chip pad near the chip, and the side surface of the first sealing member near the first pad

S37 the exposure development is performed to define a window in a side surface of the second sealing member near the chip. In this way, for each chip and the chip pad corresponding to the chip, a first window is defined in the side surface of the chip away from the chip pad

S38 at least one third blind hole is defined, by performing laser drilling, in a side surface of the second sealing member near the chip. A bottom of the third blind hole is the side surface of the chip pad that is not arranged with any chip and is away from the second pad

S39 the first window, the third blind hole, and the side surface of the second sealing member away from the first sealing member are electroplated. In this way, a second conductive line is formed between the first window and the third blind hole; and the chip is connected with the chip pads, which are not arranged with any chip and are located around the chip, through the first window, the third blind hole, and the second conductive line

PACKAGING METHOD AND PACKAGE MEMBER

CROSS REFERENCE TO RELATED APPLICATIONS

The present application is a continuation application of the international patent application No. PCT/CN2023/093328, filed on May 10, 2023, which claims the priority of Chinese patent application No. 202210822752.0, filed on Jul. 12, 2022, and contents of which are incorporated herein by its entireties.

TECHNICAL FIELD

The present disclosure relates to the field of chip packaging, and in particular to a packaging method and a package member.

BACKGROUND

The fan-out plate level package (FOPLP) technology is a kind of advanced packaging technology and has been widely applied in discrete devices. The FOPLP has a smaller area and has no substrate or an interposer. A packaged chip is thinner. A density of pins is large. In this way, demands of the market of terminal devices for chip miniaturization may be satisfied.

In the art, an internal pad is made firstly, and a chip is mounted on a side surface of the internal pad. Further, the internal pad and the chip are sealed. After sealing, grinding is performed to expose a surface of the internal pad away from the chip, such that the external pad is aligned and soldered.

However, since a plate may be expanded and retracted during processing, and since a processing accuracy may be poor during processing, a location of an external pad at which a pattern is arranged and a location of the internal pad at which a pattern is arranged may be offset. Therefore, an error may be caused during alignment, an accuracy of pattern alignment may be affected. Therefore, there may be a higher risk that the internal pad and the external pad are significantly offset, affecting the product yield.

SUMMARY OF THE DISCLOSURE

The present disclosure aims to a packaging method and a package member to solve the technical problem that the internal pad and the external pad are significantly offset.

In a first aspect, the present disclosure provides a packaging method, including: obtaining a carrier and processing at least one first pad on a side surface of the carrier; for each of the at least one first pad, processing a second pad on a side surface of the first pad away from the carrier; wherein, for each of the at least one first pad and the corresponding second pad arranged thereon, an area of an orthographic projection of the first pad is greater than an area of an orthographic projection of the second pad; obtaining a first sealing material, pressing the first sealing material with the second pad, the first pad, and a side surface of the carrier on which the at least one first pad is arranged to form a first sealing member; wherein, for each of the at least one first pad and the corresponding second pad arranged thereon, the first sealing member surrounds the second pad and covers a side surface of the first pad near the corresponding second pad and the side surface of the carrier on which the at least one first pad is arranged; for each of the at least one first pad, processing a chip pad on a side surface of the first pad away from the corresponding second pad to obtain at least one chip pad; mounting a chip on at least one of the at least one chip pad; obtaining a second sealing material, pressing the second sealing material with the chip, a side surface of each of the at least one chip pad away from the second pad, and a side surface of the first sealing member near the at least one first pad, to form a second sealing member; wherein the second sealing member covers a side surface of the chip away from the at least one chip pad, a side surface of the at least one chip pad near the chip, and the side surface of the first sealing member near the at least one first pad.

In a second aspect, the present disclosure provides a package member, including: at least one first pad and at least one second pad, wherein each of the at least one second pad is arranged on a side surface of a corresponding one of the at least one first pad, for each of the at least one first pad and the corresponding second pad arranged thereon, an area of an orthographic projection of the first pad is greater than an area of an orthographic projection of the second pad; at least one chip pad, wherein each of the at least one chip pad is arranged on a side surface of a corresponding one of the at least one first pad away from the at least one second pad; at least one chip, arranged on a side surface of at least one of the at least one chip pad away from the at least one second pad; a first sealing material, surrounding the at least one second pad and covering a side surface of each of the at least one first pad near the corresponding one of the at least one second pad; a second sealing material, covering a side surface of each of the at least one chip away from the at least one chip pad, a side surface of each of the at least one chip pad near the at least one chip, and the side surface of the first sealing member near the at least one first pad.

BRIEF DESCRIPTION OF THE DRAWINGS

In order to more clearly illustrate technical solutions in the embodiments of the present disclosure, accompanying drawings used in the description of the embodiments will be briefly introduced in the following. Apparently, the accompanying drawings in the following description show only some of the embodiments of the present disclosure. Any ordinary skilled person in the art may obtain other accompanying drawings based on these drawings without any creative work.

FIG. 1 is a flow chart of a packaging method according to a first embodiment of the present disclosure.

FIG. 2 is a flow chart of a packaging method according to a second embodiment of the present disclosure.

FIG. 8 is a flow chart of a packaging method according to a third embodiment of the present disclosure.

DETAILED DESCRIPTION

Figure 3:
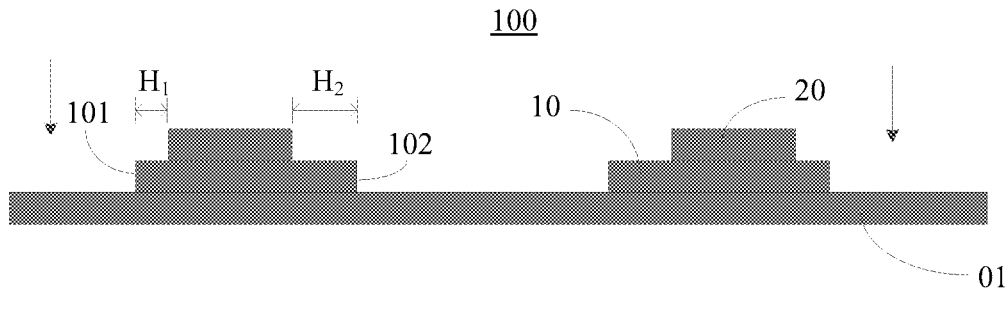
FIG. 3 is a structural schematic view of a to-be-packaged plate obtained from the operation S22 according to an embodiment of the present disclosure.

Technical solutions in the embodiments of the present disclosure will be described clearly and completely in the following by referring to the accompanying drawings in the embodiments of the present disclosure. Apparently, the described embodiments are only some of, but not all of, the embodiments of the present disclosure. Any other embodiment obtained by any ordinary skilled person in the art based on the embodiments in the present disclosure, without making creative work, shall fall within the scope of the present disclosure.

Terms in the embodiments of the present disclosure is used for the purpose of describing a particular embodiment only and is not intended to limit the present disclosure. The singular forms "a", "said", and "the" used in the present embodiments and appended claims are also referred to in the plural form. Unless other meanings are clearly indicated above, "a plurality of" generally indicate at least two features, but does not preclude at least one feature.

It is understood that, the term "and/or" used herein is merely a description of an association relationship between associated objects. Three relationships are indicated. For example, A and/or B indicates: A alone, both A and B, and B alone. In addition, the character "/" herein generally indicates that the object before the character or the object after the character.

It is understood that, terms "including", "comprising" or any other variant used herein are intended to express non-exclusive inclusion. Therefore, a process, a method, an article or an apparatus including a set of elements includes not only the listed elements but also other elements that are not expressly listed or are inherently included in the process, the method, the article or the apparatus. Without further limitation, the expression of an element being defined by the phrase "including" does not preclude existence of additional identical elements in the process, the method, the article or the apparatus.

In the art, the internal pad is made firstly, and the chip is mounted on the side surface of the internal pad. Further, the internal pad and the chip are sealed. After sealing, grinding is performed to expose the surface of the internal pad away from the chip, such that the external pad is aligned and soldered. However, since the plate may be expanded and retracted during processing, and since the processing accuracy may be poor during processing, the location of the external pad at which the pattern is arranged and the location of the internal pad at which the pattern is arranged may be offset. Therefore, an error may be caused during alignment, an accuracy of pattern alignment may be affected. Therefore, there may be a higher risk that the internal pad and the external pad are significantly offset, affecting the product yield.

Based on the above situation, the present disclosure aims to a packaging method and a package member to solve the technical problem that the internal pad and the external pad are significantly offset.

The present disclosure may be illustrated in detail by referring to the embodiments and the accompanying drawings.

As shown in FIG. 1, FIG. 1 is a flow chart of a packaging method according to a first embodiment of the present disclosure.

In the present embodiment, the packaging method includes the following.

In an operation S11, a carrier is obtained, and at least one first pad is processed on a side surface of the carrier.

In the present implementation, the carrier is a pure copper substrate.

In the present embodiment, the at least one first pad is processed on the side surface of the carrier by applying a dry film, performing exposure development, and electroplating.

Specifically, a first dry film is attached to each of two side surfaces of the carrier. The exposure development is performed to expose at least one first predetermined location on one of the two side surfaces of the carrier. The carrier attached with the first dry film is electroplated to allow the first pad to be formed at the first predetermined location.

The number of first predetermined locations may be determined based on demands, and is not limited herein.

The first dry film is an anti-plating photosensitive film. The anti-plating photosensitive film is a polymer compound. The polymer compound may undergo a polymerization reaction (a reaction process in which monomers are polymerized to form a polymer) after being irradiated by a specific light source, such that the polymer compound may to form a stable substance adhering to a surface of a plate. In this way, electroplating may be blocked.

In an operation S12, a second pad is processed on a side surface of each first pad away from the carrier. An area of an orthographic projection of the first pad is greater than an area of an orthographic projection of the second pad.

In the present embodiment, the second pad is processed on the side surface of the first pad away from the carrier by applying a dry film, performing exposure development, and electroplating.

Specifically, a second dry film is attached to the first pad, and the exposure development is performed to expose a second predetermined location on the first pad. Electroplating is performed on the entire carrier attached with the first dry film and the entire first pad attached with the second dry film. In this way, the second pad is formed at the second predetermined location.

The second dry film is an anti-plating photosensitive film.

In the present embodiment, after the second pad is processed by plating, the attached first dry film and the second dry film are removed.

It is understood that since the second pad is directly processed on the side surface of the first pad away from the carrier, a spacing between the first pad and the second pad is fixed, Therefore, poor pattern accuracy caused by subsequent alignment etching may be prevented, such that a risk of the first pad being offset relative to the second pad is reduced.

In an operation S13, first sealing material is obtained. The first sealing material is pressed with the second pad, the first pad, and the side surface of the carrier arranged with the first pad, such that a first sealing member is formed. The first sealing member surrounds the second pad and covers the side surface of the first pad near the second pad and the side surface of the carrier arranged with the first pad.

In the present embodiment, the first sealing material includes one or more of: resin, plastics, film material, and liquid epoxy.

In the present embodiment, the first sealing material is obtained. The first sealing material is pressed with the second pad, the first pad, and the side surface of the carrier arranged with the first pad, such that the first sealing material covers the side surface of the second pad away from the first pad, the side surface of the first pad near the second pad, and the side surface of the carrier arranged with the first pad. The first sealing material is ground until the side surface of the second pad away from the first pad is exposed, such that the first sealing member is formed.

Specifically, the first sealing material is pressed with the second pad, the first pad, and the carrier at a high temperature. The pressing allows the first sealing material to be melted into a semi-solidified fluid, such that the first sealing material covers the side surface of the second pad away from the first pad, the side surface of the first pad near the second pad, and the side surface of the carrier arranged with the first pad.

In the present embodiment, the first pad prepared by flipping serves as an internal pad, and the second pad serves as an external pad. Therefore, the first sealing material covering the surface of the second pad needs to be ground, such that the side surface of the second pad away from the first pad is exposed.

In other embodiments, the first sealing material covering the surface of the second pad may be removed after the chip is mounted. Removing the first sealing material is not limited herein.

It is understood that, by sealing the second pad, the first pad, and the carrier, the second pad may be prevented from falling off, such that reliability of the package member is improved.

In an operation S14, a chip pad is processed on the side surface of each first pad away from the second pad.

In the present embodiment, the carrier may be removed, such that the side surface of the first pad away from the second pad may serve as the chip pad. Alternatively, a third pad may be processed on the side surface of the carrier away from the first pad, and the third pad serves as the chip pad. An orthographic projection of the third pad coincides the orthographic projection of the first pad. The present disclosure does not limit the above. In an operation S15, the chip is mounted on at least one chip pad.

In the present embodiment, the chip may be a metal oxide semiconductor (MOS) chip.

Understandably, since the area of the orthographic projection of the first pad is greater than the are of the orthographic projection of the second pad, and since a size of the chip pad is the same as a size of the first pad, demands of mounting a large-sized chip may be satisfied, such that, the product yield may be further improved.

In an operation S16, a second sealing material is obtained and is pressed with the chip, a side surface of the chip pad away from the second pad, and the side surface of the first sealing member near the first pad, such that a second sealing member is formed. The second sealing member covers a side surface of the chip away from the chip pad, a side surface of the chip pad near the chip, and a side surface of the first sealing member near the first pad.

In the present embodiment, the chip is sealed by silk-screening the resin or laminating thermoplastics, such as polypropylene. In this way, a reduced production cost is consumed, and the chip may be fixed and sealed reliably.

In the present disclosure, the second pad is processed on the side surface of the first pad away from the carrier. In this way, the spacing between the first pad and the second pad may be fixed, a poor pattern alignment accuracy caused by alignment etching may be avoided. Therefore, a risk of the first pad being offset relative to the second pad may be prevented. After the first pad and the second pad are pro-cessed, sealing is performed to prevent the second pad from falling off, and therefore, reliability of the package member is improved. In addition, an area of an orthographic projection of the first pad is greater than an area of an orthographic projection of the second pad. Therefore, demands of mounting a large-sized chip may be met, the chip may be prevented from being exposed after cutting, and the product yield may be further improved.

FIG. 2 is a flow chart of a packaging method according to a second embodiment of the present disclosure.

In the present embodiment, the packaging method includes the following.

In an operation S21, the carrier is obtained, and at least one first pad is processed on the side surface of the carrier.

In the present embodiment, the carrier is a pure copper substrate.

In the present embodiment, the at least one first pad is processed on the side surface of the carrier by applying a dry film, performing exposure development, and electroplating.

In an operation S22, the second pad is processed on the side surface of each first pad away from the carrier. The area of the orthographic projection of the first pad is greater than the area of the orthographic projection of the second pad.

In the present embodiment, the second pad is processed on the side surface of the first pad away from the carrier by applying a dry film, performing exposure development, and electroplating.

In the packaging process, an integrated panel attached with a plurality of chips may be cut to obtain separated package members. A location where the external pad is disposed may be taken as a target, and cutting is performed based on the location of the external pad, such that at least one separated package member is obtained. In order to avoid damage to the chip during the cutting process, a certain region outside a region in which the external pad is located may be reserved, serving as a cutting position, and that is, a certain predetermined spacing is defined between the cutting position and the external pad.

In the art, the external pad is soldered to the internal pad by alignment only after the chip is mounted. Since an error in alignment may be caused easily, the internal pad may be offset relative to the external pad. When the location of the internal pad after being offset is closer to the cutting posi-tion, the internal pad and the chip mounted on the internal pad may be cut during the cutting process, such that the product yield is reduced.

In the present embodiment, the first pad has a first side and a second side opposite to the first side. In some embodi-ments, one of the first side and the second side may be close to the cutting position, or both the first side and the second side are close to the cutting position.

In a specific embodiment, in response to only the first side being close to the cutting position, the second pad is processed at a location, which is near the first side and is on the side surface of the first pad away from the carrier, such that a first spacing between the second pad and the first side is less than a second spacing between the second pad and the second side.

It will be understood that, since the first spacing between the second pad and the first side is less than the second spacing between the second pad and the second side, a safe spacing between the first pad and the cutting position may be less than a preset reservation spacing. In this way, the first pad may not be exposed during the subsequent cutting processing, and the chip may be protected from being damaged during the cutting process.

Further, when only the first side is close to the cutting position, as the first spacing between the second pad and the first side is smaller, the safe spacing, which is obtained by subtracting the first spacing from the preset spacing between the second pad and the cutting position, is larger. Therefore, in the present embodiment, the location at which the second pad is arranged may be further adjusted based on a cutting accuracy, such that the first spacing may be adjusted.

In another embodiment, in response to both the first side and the second side being close to the cutting position, the second pad is processed at a center of the side surface of the first pad away from the carrier, such that the first spacing between the second pad and the first side is equal to the second spacing between the second pad and the second side.

It is to be understood that, when both the first side and the second side are close to the cutting position, it is to be ensured that the first pad is not exposed when both the first side and the second side are cut. Therefore, the location at which the second pad is arranged cannot be shifted to either side.

Specifically, as shown in FIG. 3, FIG. 3 is a structural schematic view of a to-be-packaged plate obtained from the operation S22 according to an embodiment of the present disclosure. The to-be-packaged plate 100 includes a carrier 01, a plurality of first pads 10 disposed on a side surface of the carrier 01, and a plurality of second pads 20. Each of the plurality of second pads 20 is disposed on a side surface of one of the plurality of first pads 10 away from the carrier 01. For each of the plurality of first pads 10, a first side 101 of the first pad 10 is close to a cutting position (indicated by an arrow in FIG. 3), a first spacing H1 between the second pad 20 and the first side 101 is smaller than a second spacing H2 between the second pad 20 and a second side 102.

In an operation S23, the first sealing material is obtained and is pressed with the second pad, the first pad, and the side surface of the carrier arranged with the first pad, such that the first sealing member is formed. The first sealing member surrounds the second pad and covers the side surface of the first pad near the second pad and the side surface of the carrier arranged with the first pad.

The first sealing material includes one or more of: resin, plastics, film material, and liquid epoxy.

Figure 4:
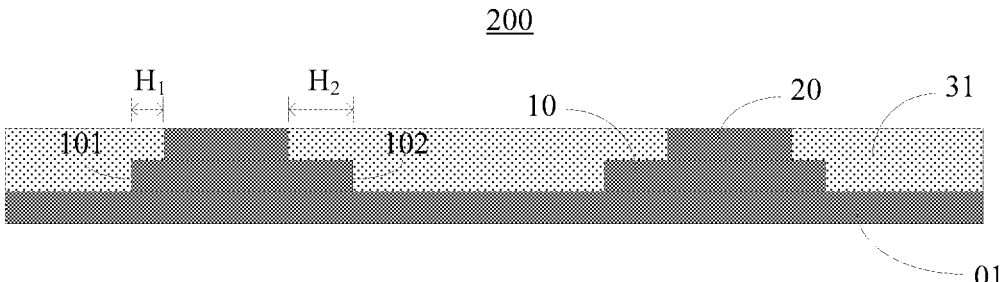
FIG. 4 is a structural schematic view of a to-be-packaged plate obtained from the operation S23 according to an embodiment of the present disclosure.

Specifically, as shown in FIG. 4, FIG. 4 is a structural schematic view of a to-be-packaged plate obtained from the operation S23 according to an embodiment of the present disclosure. The to-be-packaged plate 200 includes the carrier 01, a plurality of first pads 10 disposed on a side surface of the carrier 01, and a plurality of second pads 20. Each of the plurality of second pads 20 is disposed on a side surface of one of the plurality of first pads 10 away from the carrier 01. For each of the plurality of first pads 10, the first side 101 of the first pad 10 is close to the cutting position. The first spacing H1 between the second pad 20 and the first side 101 is less than the second spacing H2 between the second pad 20 and the second side 102. The first sealing member 31 surrounds the second pad 20 and covers the side surface of the first pad 10 near the second pad 20 and the side surface of the carrier 01 arranged with the first pad 10.

In an operation S24, the carrier is removed to enable the side surface of the first pad away from the second pad to serve as the chip pad.

In the present embodiment, the carrier is removed by etching to expose the side surface of the first pad away from the second pad, and the exposed side surface serves as the chip pad. That is, the chip pad is a soldering surface of the first pad.

Understandably, directly taking the soldering surface of the first pad as the chip pad may reduce an overall thickness of the package.

In an operation S25, the chip is mounted on at least one chip pad.

In the present embodiment, one chip may be mounted on one chip pad (the first pad). Alternatively, a plurality of chips may be mounted on one chip pad. The mounting manner is limited herein.

It will be understood that, since the area of the orthographic projection of the first pad is greater than the area of the orthographic projection of the second pad, demands of mounting large-sized chips may be satisfied.

An area of the chip is less than or equal to the area of the chip pad.

Understandably, in response to only the first side being close to the cutting position, the first spacing between the second pad and the first side is less than the second spacing between the second pad and the second side, and the safe spacing between the first pad and the cutting position is less than the preset reservation spacing. In this way, the first pad is not exposed during the cutting process, the chip may be protected from being damaged during the cutting process, and the product yield may be further improved.

Figure 5:
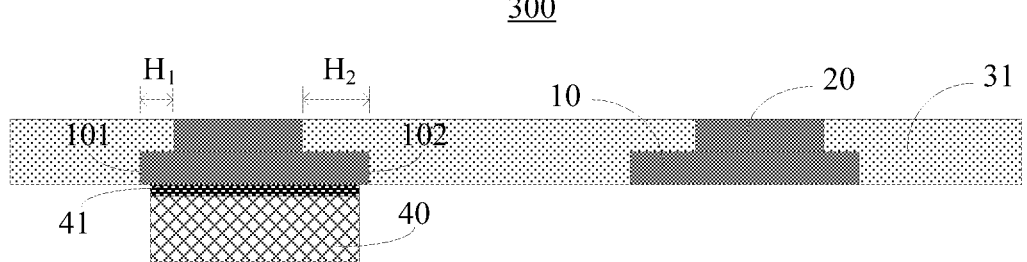
FIG. 5 is a structural schematic view of a to-be-packaged plate obtained from the operation S25 according to an embodiment of the present disclosure.

Specifically, as shown in FIG. 5, FIG. 5 is a structural schematic view of a to-be-packaged plate obtained from the operation S25 according to an embodiment of the present disclosure. The to-be-packaged plate 300 includes a plurality of first pads 10 and a plurality of second pads 20. Each of the plurality of second pads 20 is disposed on a side surface of one of the plurality of first pads 10 away from the carrier 01. For each of the plurality of first pads 10, the first side 101 of the first pad is near the cutting position, the first spacing H1 between the second pad 20 and the first side 101 is less than the second spacing H2 between the second pad 20 and the second side 102. The first sealing member 31 surrounds the second pad 20 and covers the side surface of the first pad 10 near the second pad 20. The chip 40 is arranged on the side surface of the first pad 10 away from the second pad 20. The chip 40 is bonded to the side surface of the first pad 10 away from the second pad 20 by a conductive adhesive 41.

In an operation S26, the second sealing material is obtained and is pressed with the chip, a side surface of the chip pad away from the second pad, and a side surface of the first sealing member near the first pad, such that a second sealing member is formed. The second sealing member covers the side surface of the chip away from the chip pad, the side surface of the chip pad near the chip, and the side surface of the first sealing member near the first pad.

In the present embodiment, the second sealing material includes one or more of: resin, plastics, film material, and liquid epoxy.

In the present embodiment, the second sealing material is obtained and is pressed with the chip, the side surface of the chip pad away from the second pad, and the side surface of the first sealing member near the first pad, such that the second sealing member covers the side surface of the chip away from the chip pad, the side surface of the chip pad near the chip, and the side surface of the first sealing member near the first pad. In this way, the second sealing member is formed.

Figure 6:
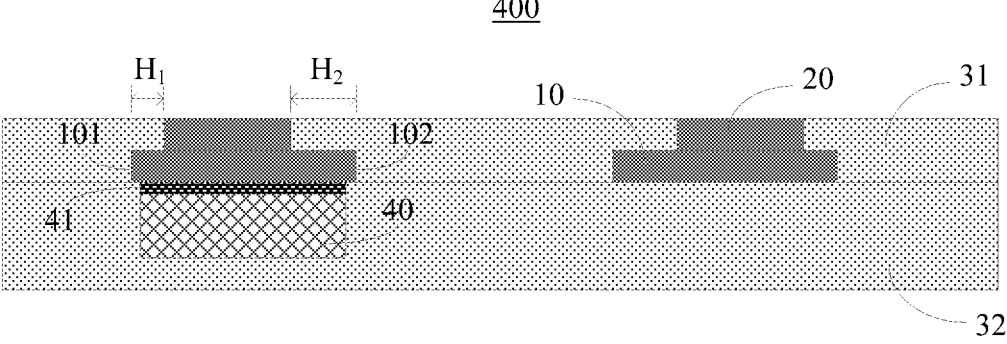
FIG. 6 is a structural schematic view of a to-be-packaged plate obtained from the operation S26 according to an embodiment of the present disclosure.

Specifically, as shown in FIG. 6, FIG. 6 is a structural schematic view of a to-be-packaged plate obtained from the operation S26 according to an embodiment of the present disclosure. The to-be-packaged plate 400 includes a plurality of first pads 10 and a plurality of second pads 20. Each of the plurality of second pads 20 is disposed on a side surface of one of the plurality of first pads 10 away from the carrier 01. For each of the plurality of first pads 10, the first side 101 of the first pad is near the cutting position, the first spacing H1 between the second pad 20 and the first side 101 is less than the second spacing H2 between the second pad 20 and the second side 102. The first sealing member 31 surrounds the second pad 20 and covers the side surface of the first pad 10 near the second pad 20. The chip 40 is arranged on the side surface of the first pad 10 away from the second pad 20. The second sealing member 32 covers the side surface of the chip 40 away from the first pad the side surface of the first pad 10 near the chip 40, and the side surface of the first sealing member 31 near the first pad 10.

In an operation S27, at least one first blind hole and at least one second blind hole are defined in the side surface of the second sealing member near the chip by performing laser drilling. A bottom of the first blind hole is a side surface of the chip away from the chip pad. A bottom of the second blind hole is a side surface of the chip pad without any chip and away from the second pad.

In the present embodiment, the laser includes an ultra-violet (UV) laser and/or a carbon dioxide ($CO_2$) laser.

In an operation S28, the first blind hole, the second blind hole, and the side surface of the second sealing member away from the first sealing member are electroplated. In this way, a first conductive line is formed between the first blind hole and the second blind hole; and the chip is connected to chip pads, which are not arranged with any chip and are located around the chip, through the first blind hole, the second blind hole, and the formed first conductive line.

In an operation S29, a reinforcement material is obtained and is pressed with the first blind hole, the second blind hole, the first conductive line, and the side surface of the second sealing member away from the first sealing member to form a reinforcement layer.

In the present embodiment, the reinforcement material may be an insulating substance such as epoxy of glass fibers or liquid epoxy, which is not limited herein.

Further, an ink may be coated on the side surface of the reinforcement layer away from the second sealing member to form a solder resist layer, such that a desired appearance may be produced on the solder resist layer.

Figure 7:
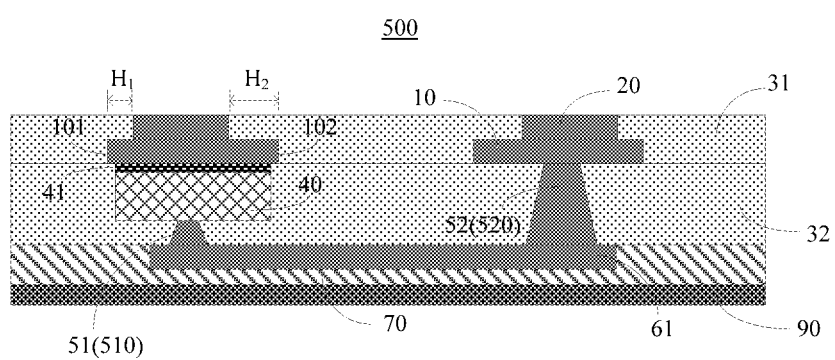
FIG. 7 is a structural schematic view of a package member according to a first embodiment of the present disclosure.

Specifically, as shown in FIG. 7, FIG. 7 is a structural schematic view of a package member according to a first embodiment of the present disclosure. The package member 500 includes a plurality of first pads 10 and a plurality of second pads 20. Each of the plurality of second pads 20 is disposed on a side surface of one of the plurality of first pads 10 away from the carrier 01. For each of the plurality of first pads 10, the first side 101 of the first pad 10 is near the cutting position, the first spacing H1 between the second pad 20 and the first side 101 is less than the second spacing H2 between the second pad 20 and the second side 102. The first sealing member 31 surrounds the second pad 20 and covers the side surface of the first pad 10 near the second pad 20. The chip 40 is arranged on the side surface of the first pad 10 away from the second pad 20. The second sealing member 32 covers the side surface of the chip 40 away from the first pad 10, the side surface of the first pad 10 near the chip 40, and the side surface of the first sealing member 31 near the first pad 10. The bottom of the first blind hole 51 is the side surface of the chip 40 away from the first pad 10. The bottom of the second blind hole 52 is the side surface of the first pad 10 that is away from the second pad 20 and is not arranged with any chip. A first conductive connection post 510 is formed in the first blind hole 51. A second conductive connection post 520 is formed in the second blind hole 52. The first conductive line 61 is formed between the first conductive connection post 510 and the second conductive connection post 520. The chip 40 is electrically connected with the first pads 10 surrounding the chip 40 through the first conductive connection post 510, the second conductive connection post 520, and the first conductive line 61. The reinforcement layer 70 covers a side surface of the first conductive line 61 away from the first blind hole 51 and the side surface of the second sealing member 32 away from the first sealing member 31. The solder resist layer 90 is arranged on the side surface of the reinforcement layer 70 away from the second sealing member 32.

According to the present disclosure, the second pad is processed on the side surface of the first pad away from the carrier. In this way, the spacing between the first pad and the second pad may be fixed, a poor pattern alignment accuracy caused by alignment etching may be avoided. Therefore, a risk of the first pad being offset relative to the second pad may be prevented. After the first pad and the second pad are processed, sealing is performed to prevent the second pad from falling off, and therefore, reliability of the package member is improved. In addition, an area of an orthographic projection of the first pad is greater than an area of an orthographic projection of the second pad. Therefore, demands of mounting a large-sized chip may be met, the chip may be prevented from being exposed after cutting, and the product yield may be further improved. Furthermore, since the first spacing between the second pad and the first side is less than the second spacing between the second pad and the second side, the safe spacing between the first pad and the cutting position may be less than the preset reservation spacing. In this way, the first pad is not exposed during the subsequent cutting process, and the chip is protected from being damaged during the cutting process.

As shown in FIG. 8, FIG. 8 is a flow chart of the packaging method according to a third embodiment of the present disclosure.

In the present embodiment, the packaging method includes the following.

In an operation S31, the carrier is obtained, and at least one first pad is processed on the side surface of the carrier.

Detailed processes may be referred to operations of S11 and S21, and will not be repeated herein.

In an operation S32, the second pad is processed on the side surface of each first pad away from the carrier. The area of the orthographic projection of the first pad is greater than the area of the orthographic projection of the second pad.

Detailed processes may be referred to operations of S12 and S22, and will not be repeated herein.

In an operation S33, the first sealing material is obtained and is pressed with the second pad, the first pad, and the side surface of the carrier arranged with the first pad, such that the first sealing member is formed. The first sealing member surrounds the second pad and covers the side surface of the first pad near the second pad and the side surface of the carrier arranged with the first pad.

Detailed processes may be referred to operations of S13 and S23, and will not be repeated herein.

In an operation S34, the third pad is processed on the side surface of the carrier away from the first pad and serves as the chip pad. The orthographic projection of the third pad coincides the orthographic projection of the first pad.

In the present embodiment, the rest part of the carrier that does not correspond to any first pad is removed by pattern etching, such that the third pad is formed.

Figure 9:
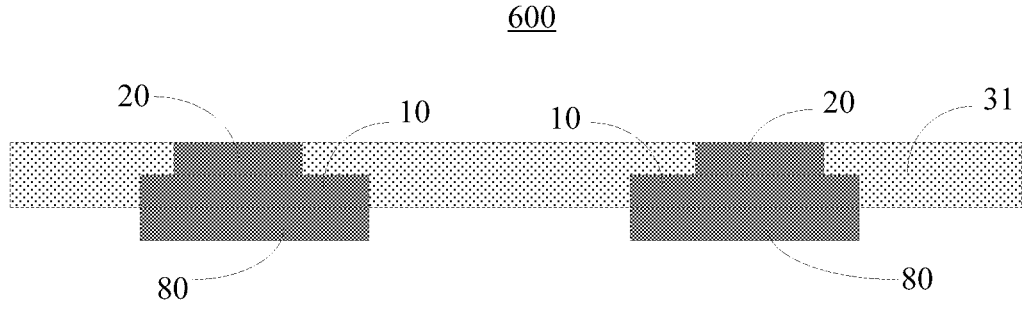
FIG. 9 is a structural schematic view of a to-be-packaged plate obtained from the operation S34 according to an embodiment of the present disclosure.

Specifically, as shown in FIG. 9, FIG. 9 is a structural schematic view of a to-be-packaged plate obtained from the operation S34 according to an embodiment of the present disclosure. The to-be-packaged plate 600 includes a plurality of first pads 10 and a plurality of second pads 20. Each of the plurality of second pads 20 is disposed on a side surface of one of the plurality of first pads 10 away from the carrier 01. The first sealing member 31 surrounds the second pad 20 and covers the side surface of the first pad 10 near the second pad 20. The third pad 80 is disposed on the side surface of the first pad 10 away from the second pad 20. The orthographic projection of the third pad 80 coincides with the orthographic projection of the first pad 10.

In an operation S35, the chip is mounted on at least one chip pad.

In the present embodiment, one chip may be mounted on one third pad, or a plurality of chips may be mounted on one third pad. The mounting manner is limited herein.

The area of the chip is less than or equal to the area of the third pad.

In an operation S36, the second sealing material is obtained and is pressed with the chip, the side surface of the chip pad away from the second pad, and the side surface of the first sealing member near the first pad, such that the second sealing member is formed. The second sealing member covers the side surface of the chip away from the chip pad, the side surface of the chip pad near the chip, and the side surface of the first sealing member near the first pad.

In the present embodiment, the second sealing material may be photosensitive epoxy material.

In an operation S37, the exposure development is performed to define a window in a side surface of the second sealing member near the chip. In this way, for each chip and the chip pad corresponding to the chip, a first window is defined in the side surface of the chip away from the chip pad.

Understandably, since the energy of the laser may not be controlled well, the chip, especially the MOS chip, may be damaged when the laser is used for drilling. In the present embodiment, the photosensitive epoxy material is taken as the material of the second sealing member, the window is defined by performing exposure development on the dry film. In this way, the energy for defining the window may be controlled properly, the chip may be prevented from being damaged during defining the window, and reliability of the product is improved.

In an operation S38, at least one third blind hole is defined, by performing laser drilling, in a side surface of the second sealing member near the chip. A bottom of the third blind hole is the side surface of the chip pad that is not arranged with any chip and is away from the second pad.

In an operation S39, the first window, the third blind hole, and the side surface of the second sealing member away from the first sealing member are electroplated. In this way, a second conductive line is formed between the first window and the third blind hole; and the chip is connected with the chip pads, which are not arranged with any chip and are located around the chip, through the first window, the third blind hole, and the second conductive line.

In the present embodiment, a third conductive connection post is formed in the first window, and a fourth conductive connection post is formed within the third blind hole, such that the chip is electrically connected to the surrounding third pads that are not arranged with any chip via the third conductive connection post, the fourth conductive connection post, and the second conductive line.

Further, a reinforcement material is obtained and is pressed with the first window, the third blind hole, the second conductive line, and the side surface of the second sealing member away from the first sealing member, such that a reinforcement layer is formed.

Further, an ink may be coated on a side surface of the reinforcement layer away from the second sealing member to form a solder resist layer, and a desired appearance may be produced on the solder resist layer.

Figure 10:
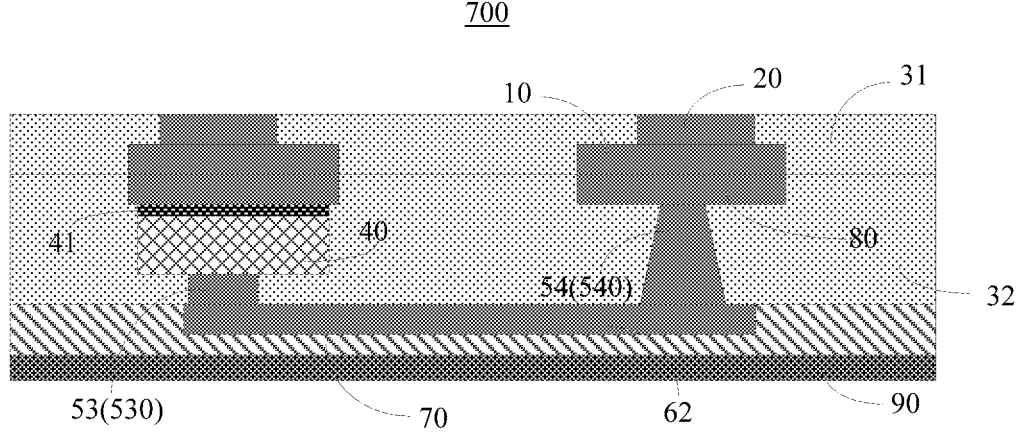
FIG. 10 is a structural schematic view of a package member according to a second embodiment of the present disclosure.

Specifically, as shown in FIG. 10, FIG. 10 is a structural schematic view of a package body according to a second embodiment of the present disclosure. The to-be-packaged plate 700 includes a plurality of first pads 10 and a plurality of second pads 20. Each of the plurality of second pads 20 is disposed on a side surface of one of the plurality of first pads 10 away from the carrier 01. The first sealing member 31 surrounds the second pad 20 and covers the side surface of the first pad 10 near the second pad 20. The third pad 80 is disposed on the side surface of the first pad 10 away from the second pad 20. The orthographic projection of the third pad 80 coincides with the orthographic projection of the first pad 10. The chip 40 is arranged on the side surface of the third pad 80 away from the first pad 10. The second sealing member 32 covers the side surface of the chip 40 away from the third pad 80, the side surface of the third pad 80 near the chip 40, and the side surface of the first sealing member 31 near the first pad 10. The first window 53 is defined in the side surface of the chip away from the third pad 80. The bottom of the third blind hole 54 is the side surface of the third pad 80 that is away from the second pad 20 and is not arranged with any chip. The third conductive connection post 530 is formed in the first window 53, the fourth conductive connection post 540 is formed in the third blind hole 54, and the second conductive line 62 is formed between the third conductive connection post 530 and the fourth conductive connection post 540. The chip 40 is electrically connected to the surrounding third pads 80 through the third conductive connection post 530, the fourth conductive connection post 540, and the second conductive line 62. The reinforcement layer 70 covers the side surface of the second conductive line 62 away from the first window 53 and the side surface of the second sealing member 32 away from the first sealing member 31. The solder resist layer 90 is arranged on the side surface of the reinforcement layer 70 away from the second sealing member 32.

According to the present disclosure, the second pad is processed on the side surface of the first pad away from the carrier. In this way, the spacing between the first pad and the second pad may be fixed, a poor pattern alignment accuracy caused by alignment etching may be avoided. Therefore, a risk of the first pad being offset relative to the second pad may be prevented. After the first pad and the second pad are processed, sealing is performed to prevent the second pad from falling off, and therefore, reliability of the package member is improved. In addition, an area of an orthographic projection of the first pad is greater than an area of an orthographic projection of the second pad. Therefore, demands of mounting a large-sized chip may be met, the chip may be prevented from being exposed after cutting, and the product yield may be further improved. Furthermore, by defining the window, the first window is defined on the side surface of the chip away from the chip pad, damage to the chip caused by laser drilling may be prevented, such that the reliability of the product is further improved.

The above shows only embodiments of the present disclosure, and is not intended to limit the scope of the present disclosure. Any equivalent structure or equivalent process transformation performed based on the contents of the specification and the accompanying drawings of the present disclosure, applied directly or indirectly in other related arts, shall be equivalently included in the scope of the present disclosure.

What is claimed is:

1. A packaging method, comprising:
obtaining a carrier and processing at least one first pad on a side surface of the carrier;
for each of the at least one first pad, processing a second pad on a side surface of the first pad away from the carrier; wherein, for each of the at least one first pad and the corresponding second pad arranged thereon, an area of an orthographic projection of the first pad is greater than an area of an orthographic projection of the second pad;
obtaining a first sealing material, pressing the first sealing material with the second pad, the first pad, and a side surface of the carrier on which the at least one first pad is arranged to form a first sealing member; wherein, for each of the at least one first pad and the corresponding second pad arranged thereon, the first sealing member surrounds the second pad and covers a side surface of the first pad near the corresponding second pad and the side surface of the carrier on which the at least one first pad is arranged; and a side surface of the second pad facing away from the first pad is exposed out of the first sealing material;
for each of the at least one first pad, processing a chip pad on a side surface of the first pad away from the corresponding second pad to obtain at least one chip pad;
mounting a chip on at least one of the at least one chip pad;
obtaining a second sealing material, pressing the second sealing material with the chip, a side surface of each of the at least one chip pad away from the second pad, and a side surface of the first sealing member near the at least one first pad, to form a second sealing member; wherein the second sealing member covers a side surface of the chip away from the at least one chip pad, a side surface of the at least one chip pad near the chip, and the side surface of the first sealing member near the at least one first pad.

2. The packaging method according to claim 1, wherein for each of the at least one first pad,
the first pad has a first side and a second side opposite to the first side;
in response to only the first side being located near a cutting position, the processing a second pad on a side surface of the first pad away from the carrier, comprises:
processing the second pad at a location, which is on the side surface of the first pad away from the carrier and is near the first side, wherein a first spacing between the second pad and the first side is less than a second spacing between the second pad and the second side.

3. The packaging method according to claim 2, wherein in response to both the first side and the second side being near the cutting position, the processing a second pad on a side surface of the first pad away from the carrier, comprises:
processing the second pad at a central region of the side surface of the first pad away from the carrier, wherein the first spacing between the second pad and the first side is equal to the second spacing between the second pad and the second side.

4. The packaging method according to claim 1, wherein the processing a chip pad on a side surface of the first pad away from the corresponding second pad, comprises:
removing the carrier; for each of the at least one first pad, the side surface of the first pad away from the second pad serving as the chip pad.

5. The packaging method according to claim 1, wherein the processing a chip pad on a side surface of the first pad away from the corresponding second pad, comprises:
processing a third pad on the side surface of the carrier away from the at least one first pad, wherein the third pad serves as the chip pad, and an orthographic projection of the third pad coincides with an orthographic projection of the first pad.

6. The packaging method according to claim 1, wherein the first sealing material comprises one or more of: resin, plastics, film material, and liquid epoxy.

7. The packaging method according to claim 1, wherein the second sealing material is photosensitive epoxy material.

8. The packaging method according to claim 6, wherein, after the obtaining a second sealing material, pressing the second sealing material with the chip, a side surface of each of the at least one chip pad away from the second pad, and a side surface of the first sealing member near the at least one first pad, to form a second sealing member, the method further comprises:
defining, by performing laser drilling, at least one first blind hole and at least one second blind hole in a side surface of the second sealing member near the chip; wherein the at least one chip pad comprise a first chip pad and a second chip pad, the chip is mounted on the first chip pad, no chip is mounted on the second chip pad, a bottom of each of the at least one first blind hole is a side surface of the chip away from the first chip pad, a bottom of each of the at least one second blind hole is a side surface of the second chip pad away from the second pad;
electroplating the at least one first blind hole, the at least one second blind hole, and a side surface of the second sealing member away from the first sealing member, wherein a first conductive line is formed between each of the at least one first blind hole and a corresponding one of the at least one second blind hole, the chip is connected to any chip pad, which is not arranged with the chip and is located around the chip, through the at least one first blind hole, the at least one second blind hole, and the first conductive line.

9. The packaging method according to claim 7, wherein after the obtaining a second sealing material, pressing the second sealing material with the chip, a side surface of each of the at least one chip pad away from the second pad, and a side surface of the first sealing member near the at least one first pad, to form a second sealing member, the method further comprises:
performing exposure development to define a window in a side surface of the second sealing member near the chip, wherein a first window is defined in a side surface of each chip away from the chip pad;
defining, by performing laser drilling, at least one third blind hole in a side surface of the second sealing member near the chip, wherein the at least one chip pad comprise a first chip pad and a second chip pad, the chip is mounted on the first chip pad, no chip is mounted on the second chip pad, a bottom of each of the at least one third blind hole is a side surface of the second chip pad away from the second pad;

electroplating the first window, the at least one third blind hole, and the side surface of the second sealing member away from the first sealing member, wherein a second conductive line is formed between the first window and the at least one third blind hole, the chip is connected with any chip pad, which is not arranged with the chip and is located around the chip, through the first window, the at least one third blind hole, and the second conductive line.

10. The packaging method according to claim 8, wherein the laser comprises an ultraviolet laser and/or a carbon dioxide laser.

11. The packaging method according to claim 8, wherein after the electroplating the at least one first blind hole, the at least one second blind hole, and a side surface of the second sealing member away from the first sealing member, the method further comprises:

obtaining a reinforcement material and pressing the reinforcement material with the at least one first blind hole, the at least one second blind hole, the first conductive line, and the side surface of the second sealing member away from the first sealing member to form a reinforcement layer.

12. The packaging method according to claim 11, wherein after the obtaining a reinforcement material and pressing the reinforcement material with the at least one first blind hole, the at least one second blind hole, the first conductive line, and the side surface of the second sealing member away from the first sealing member to form a reinforcement layer, the method further comprises:

coating an ink on the side surface of the reinforcement layer away from the second sealing member to form a solder resist layer.

13. The packaging method according to claim 1, wherein the obtaining a first sealing material, pressing the first sealing material with the second pad, the first pad, and a side surface of the carrier on which the at least one first pad is arranged to form a first sealing member, comprises:

obtaining the first sealing material, pressing the first sealing material with the second pad, the first pad, and the side surface of the carrier on which the at least one first pad is arranged to allow the first sealing material to cover the side surface of the second pad away from the at least one first pad, the side surface of each of the at least one first pad near the corresponding second pad, and the side surface of the carrier on which the at least one first pad is arranged; and grinding the first sealing material until exposing the side surface of the second pad away from the at least one first pad to form the first sealing member.

14. The packaging method according to claim 1, wherein the carrier is a pure copper substrate; and the obtaining a carrier and processing at least one first pad on a side surface of the carrier, comprises:

processing, by applying a dry film, performing exposure development, and electroplating, the at least one first pad on the side surface of the carrier.

15. The packaging method according to claim 1, wherein the mounting a chip on at least one of the at least one chip pad, comprises:

mounting one chip on one of the at least one chip pad; or mounting a plurality of chips on one of the at least one first pad.

16. The packaging method according to claim 15, wherein the chip comprises a metal oxide semiconductor chip.

17. The packaging method according to claim 15, wherein the chip is bonded to the chip pad by a conductive adhesive.

18. A package member, comprising:

at least one first pad and at least one second pad, wherein each of the at least one second pad is arranged on a side surface of a corresponding one of the at least one first pad, for each of the at least one first pad and the corresponding second pad arranged thereon, an area of an orthographic projection of the first pad is greater than an area of an orthographic projection of the second pad;

at least one chip pad, wherein each of the at least one chip pad is arranged on a side surface of a corresponding one of the at least one first pad away from the at least one second pad;

at least one chip, arranged on a side surface of at least one of the at least one chip pad away from the at least one second pad;

a first sealing material, surrounding the at least one second pad and covering a side surface of each of the at least one first pad near the corresponding one of the at least one second pad;

a second sealing material, covering a side surface of each of the at least one chip away from the at least one chip pad, a side surface of each of the at least one chip pad near the at least one chip, and the side surface of the first sealing member near the at least one first pad;

wherein, for each of the at least one chip pad and the corresponding one of the at least one first pad, an area of an orthographic projection of the chip pad onto the first sealing material is equal to the area of the orthographic projection of the first pad onto the first sealing material.

19. The package member according to claim 18, wherein, for each of the at least one first pad and the corresponding one of the at least one second pad, the first pad has a first side and a second side opposite to the first side; a first spacing between the second pad and the first side is less than a second spacing between the second pad and the second side; and the first side is disposed, relative to the second side, closer to a cutting position.

20. The package member according to claim 18, wherein, for each of the at least one first pad and the corresponding one of the at least one second pad, the first pad has a first side and a second side opposite to the first side; a first spacing between the second pad and the first side is equal to a second spacing between the second pad and the second side; and both the first side and the second side are near a cutting position.

* * * * *